United States Patent [19]

Sternbeck

[11] 3,825,848

[45] July 23, 1974

[54] INTEGRATED AMPLIFIER

[75] Inventor: Olaf Sternbeck, Bromma, Sweden

[73] Assignee: Telefonaktiebolaget LM Ericsson, Stockholm, Sweden

[22] Filed: Dec. 18, 1972

[21] Appl. No.: 316,403

[30] Foreign Application Priority Data

Jan. 5, 1972 Sweden .................................. 93/72

[52] U.S. Cl....................... 330/17, 179/1 A, 330/22, 330/38 M

[51] Int. Cl.............................................. H03f 3/18

[58] Field of Search............... 330/38 M, 22, 40, 17; 179/1 A

[56] References Cited

UNITED STATES PATENTS

| | | | |
|---|---|---|---|
| 3,440,351 | 4/1969 | Boll | 330/22 X |
| 3,491,203 | 1/1970 | Shabad | 179/1 A |
| 3,551,833 | 12/1970 | Hilbert et al. | 330/22 |
| 3,602,830 | 8/1971 | Hurd | 330/40 X |
| 3,665,330 | 5/1972 | Tharmaratnam | 330/38 M X |
| 3,668,320 | 6/1972 | Duck | 179/1 A |

*Primary Examiner*—Herman Karl Saalbach
*Assistant Examiner*—James B. Mullins
*Attorney, Agent, or Firm*—Hane, Baxley & Spiecens

[57] ABSTRACT

An integrated circuit preamplifier formed on a single substrate divided into regions by insulation frames connected with the microphone of a telephone subset via transistor preamplifier and transistor output amplifiers in different regions to the subscriber's line. The operating voltages for the amplifiers are received via a conductor which has a decoupling resistor between the points which supply the respective amplifiers, and the portion of such conductor connected to the output amplifier is connected via a decoupling capacitor to a reference potential point.

7 Claims, 1 Drawing Figure

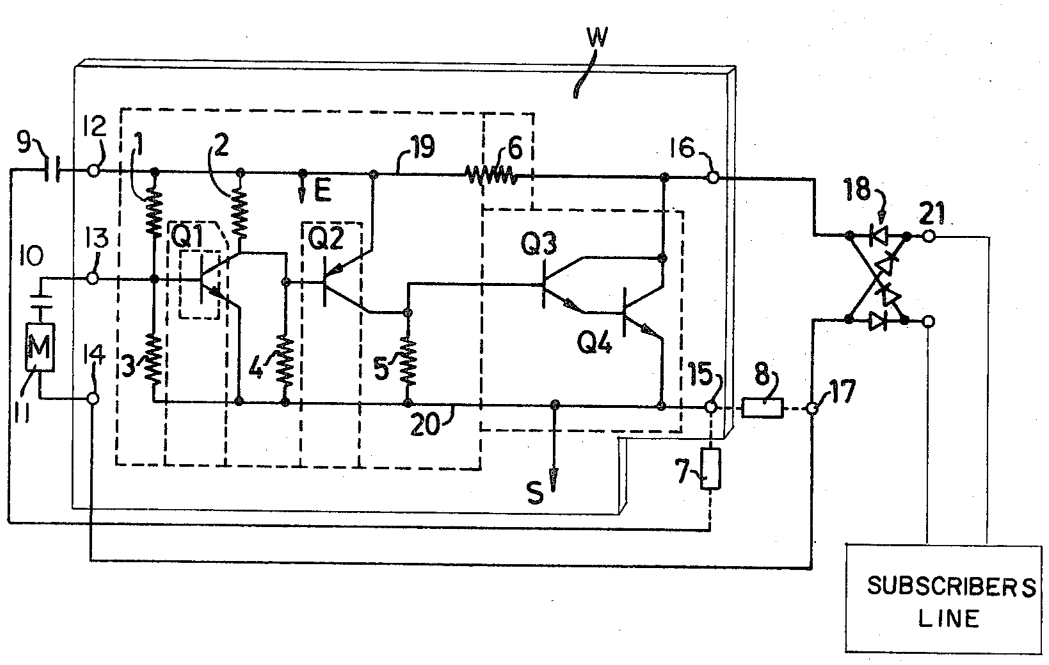
W
9
12
1
2
19
6
16
E
18
21
10
13
Q1
Q2
Q3
Q4
M
11
14
3
4
5
15
8
17
20
7
S
SUBSCRIBERS LINE

INTEGRATED AMPLIFIER

This invention relates to an integrated amplifier with transistors and resistors as constituent switching elements in the amplifier, and made of a monolithic silicon wafer.

Amplifiers of the general kind here referred to can find use as microphone amplifiers in telephone sets, the amplifier supply coming via the telephone subscriber's line.

The method of making microphone amplifiers in the form of integrated circuits with transistors composed of a monolithic wafer and, the output terminals of the amplifier serving at the same time as feed points for the D.C. supply of the transistors is previously known. Special difficulties are, however, found to arise in such a case, since the total output current consists of a constant direct current with a superimposed output signal alternating current causing momentary current minima to occur during the operation of the amplifier. These current minima may cause momentary disturbing shifts of the respective characteristics and insulation potentials relative to the monolithic substrate with to the constituent transistors, diodes and resistors in the amplifier.

The now common method of monolithic integration, using a silicon substrate, comprises in a typical case a *p* substrate, an *n*-subcollector for overlying transistors, an epitaxial *n*-top layer, *p*-positive base regions with *n*-positive emitter regions situated within them for npn transistors and *p*-positive insulation frames surrounding the respective components. In some cases more than one component may be placed within the same insulation frame.

An insulation with high insulation resistance for a component within the associated insulation frame, which is connected to the substrate without any intermediate barrier layer (ohmic connection), is obtained in principle because the component is kept at a positive potential vis-a-vis the substrate during operation, whereby the *n*-doped material in the epitactic layer within the insulation frame will receive a reverse voltage at the pn junction to the substrate and thereby become insulated from the substrate. Components in the integrated circuit which receive reverse voltages at different voltage levels on functional grounds must retain their mutual levels and polarities also during operation.

A microphone amplifier for telephone sets must, from the circuitry point of view, be made up in such way that attention is paid to the aforementioned D.C. supply via the output terminals of the amplifier. This means that the circuit design of such an amplifier cannot, without invention work, be achieved on the basis of the insight gained through the study of already known simple integrated amplifiers.

For the use of the amplifier in a subscriber's telephone set there is the requirement that the actual amplifier, possibly with accessory components in the form, for example, of external decoupling capacitors and resistors, be manufactured at a very low price in order to be put to general use in the subscriber's telephone sets which exist in very large numbers in the present telephone systems, since the total price of the microphone amplifiers in the subscriber's telephone sets will nevertheless amount to a very large sum. An amplifier of the kind envisaged should therefore be entirely integrated and, if possible, have no external accessory components. As a result of the integrated mode of current supply, however, it is necessary to introduce decoupling elements in the amplifier in order to prevent both acoustic feedback and modulation of the signal entering the input terminals of the amplifier by variations of the output current. Amplifier decoupling arrangements with capacitive and resistive elements have the desired result, but it is a question of finding a solution which is economically advantageous. The method of using a resistive element in combination with the avalanche diode for decoupling in amplifiers — also of the integrated type — is already known, the latter working in the ordinary way in the reverse direction and replacing the capacitive elements. In integrated amplifier circuits formed on a monolithic wafer there are often very great difficulties in obtaining suitable avalanche voltages for integrated avalenche diodes in the circuit, since the diffusion process used in the manufacture is usually carried out in order to obtain an optimal value with respect to certain transistor data as well as of resistor data. The diodes are then obtained rather as a by-product and will exhibit avalanche voltages of 6–8 volts.

In a microphone amplifier of this kind it is important to give a suitable form to the input transistor and the resistors, if any, which exist in the vicinity of the transistor at the signal input terminals, as well as to the supply of the input transistor. As already indicated, it is especially important that no disturbing modulation takes place within the said region as a result of the amplifier supply current. This is dependent on the condition that neither the input transistor itself nor the associated resistors formed in the monolithic wafer are subjected to interference modulation by resistive means, and, as regards the resistors, they must not be subjected to interference modulation arising capacitively via the counterdoped epitaxial layers surrounding them. The same applies to subsequent amplifier stages in the microphone amplifier, but in this case the requirements are not fully so strict.

An object of the invention is to provide a microphone amplifier in which the aforementioned disadvantages have been avoided and in which the requirements specified in respect of the avoidance of interference modulation have been fulfilled through an arrangement which allows economic manufacture of the device.

The special characteristics of the invention are set out in the appended claims.

In order that the invention may be better understood, and to indicate additional aims and advantages one embodiment of the invention will be described with reference to the accompanying drawing, which shows a circuit diagram for a microphone amplifier according to the invention.

The microphone amplifier shown in the drawing is intended to be realized through an integrated circuit formed on a monolithic wafer W, using the common method of which the principles have already been indicated, and the amplifier is intended for use in conjunction with a telephone set, for example a subscriber's telephone with an electromagnetic microphone.

In the embodiment shown, the interference modulation has been effectively prevented through the fact that a decoupling resistor, introduced between the voltage gain (preamplifier) unit and output unit of the amplifier, acts in combination with an external decoupling capacitor with a moderate capacitance. Furthermore the counterdoped epitaxial layer is common to five resistors situated adjacent to the input stage. Through these two measures in combination, an extremely great reduction of the interference modulation in the amplifier is obtained.

The amplifier circuit shown in the drawing contains a voltage gain unit with the two transistors Q1 and Q2 and an output stage, with transistors Q3 and Q4, arrayed in a Darlington configuration coupling. In the circuit diagram shown the transistors Q1, Q3 and Q4 are of the npn type, while transistor Q2 is of the pnp type. The invention is, however, not limited to the combination shown, but other combinations of transistors are conceivable within the scope of the invention.

The amplifier shown in the drawing with the aforementioned transistor combination has a pair of output terminals 15 and 16 which at the same time serve for the D.C. supply of the amplifier. This D.C. supply voltage is obtained from points 21 and 22, connected to the subscriber's line, via a fullwave rectifier 18 which has been introduced in order that the amplifier may receive a D.C. supply voltage with correct polarity irrespective of the manner of connection of the the subscriber's line. Output terminal 16 is in direct connection with the subscriber's line 21, 22 via the fullwave rectifier 18, and output terminal 15 is in connection with said subscriber's line 21, 22 via the rectifier 18 and a resistor 8, the purpose of which will be described later and for that matter could be eliminated from the point of view the amplification function, and via the fullwave rectifier. One end of resistor 8 is connected to the output terminal 15 and the other end to an output point 17 to the fullwave rectifier 18.

The output terminal 15 feeds a "low potential feed conductor" 20 which, via the conductor denoted S, is in conductive connection with the substrate of the integrated circuit. The output terminal 16 feeds, via a decoupling resistor 6, a "high potential feed conductor" 19 which, via the conductor denoted E, is in conductive connection with the aforesaid counterdoped epitactic layer.

The voltage gain unit of the amplifier comprises the transistors Q1, here of the npn type, and Q2, here of the pnp type. The base of transistor Q1 receives a suitable working voltage via a resistor 1 which is connected between the base and feed conductor 19, and another resistor 3 which is connected between the base and feed conductor 20. In the case shown the feed conductor 19 has positive potential in relation to the feed conductor 20. The emitter of transistor Q1 is directly connected to the feed conductor 20 and the collector of transistor Q1 is connected via a resistor 2 to the feed conductor 19 and directly connected to the base of transistor Q2, and the latter base is connected via a resistor 4 to the feed conductor 20. The emitter of transistor Q2 is directly connected to the feed conductor 19 and the collector of transistor Q2 is connected via a resistor 5 to the feed conductor 20 and directly connected to the base of transistor Q3, which forms part of the output stage of the amplifier. The collector of transistor Q3 is directly connected to the output terminal 16 and the emitter of transistor Q3 is directly connected to the base of the second transistor Q4 of the output stage. The transistor Q4 has its collector directly connected to output terminal 16 and its emitter directly connected to the feed conductor 20 and is thus directly connected to output terminal 15. Transistors Q3 and Q4 are of the npn type.

The amplifier also has signal input terminals 13 and 14, of which input terminal 13 is directly connected to the base of transistor Q1 and input terminal 14 is connected to output terminal 15 via the aforesaid resistor 8.

The input terminals 13 and 14 in the case shown are connected preferably to an electromagnetic microphone 11 forming part of the subscriber's telephone set and the D.C. blocking capacitor 10 in order that the D.C. resistance of the microphone 11 shall not alter the operating point of transistor Q1 preset by means of resistors 1 and 3.

In order that the aforementioned current minima shall not disturb the voltage unit of the amplifier — and thus primarily transistor Q1 with associated resistors 1 and 3 — the already mentioned decoupling resistor 6 has been introduced. In the case shown this resistor works in combination with a decoupling capacitor 9, one terminal of which is connected to the end of resistor 6 remote from output terminal 16 via point 12 and the feed conductor 19. The other terminal of the capacitor 9 is connected to output terminal 15, and thus to feed conductor 20, via a resistor 7 which is not unconditionally necessary from the amplification point of view but could be omitted. In this way the desired decoupling in respect of transistors Q1 and Q2 is obtained.

Resistors 7 and 8 have secondary tasks with respect to the setting of the output impedance and operational gain.

For integration according to the usual methods of the kinds already referred to it is usual to arrange for each component a special insulation frame with a junction. Using a circuit diagram for the amplifier as shown in the figure, however, it is possible to attain a great simplification by placing resistors 1, 2, 3, 4 and 5 within the same insulation frame, which is possible since the *n*-material of the epitaxial layer within the frame in question is directly connected — without any barrier layers — to the end of the decoupling resistor 6, which is directly connected to the feed conductor 19 and thus to the supply point for the input stage.

The already mentioned capacitor 9 has an additional important function apart from the decoupling function, namely, for the loading of transistor Q4 as a result of a signal entering the input terminals of the amplifier, to maintain the potential at point 12 and thus also on the feed conductor 19 constant in relation to the potential at point 15 and the potential on the feed conductor 20. The capacitor 9 is here assumed to constitute an accessory component of the actual monolithic circuit — thus an "external" component — owing to the fact that the capacitor 9 should have a capacitance of the order of one microfarad.

The resistor 6 can be included in the monolithic circuit, but in such case cannot lie entirely within the same insulation frame as resistors 1–5 or as transistors Q3 and Q4. Part of resistor 6, on the other hand, can be accommodated within the insulation frame of resistors 1–5 and the remainder of resistor 6 has an insulation frame of its own. Each of transistors Q1 and Q2 has its own insulation frame and transistors Q3 and Q4 can be placed within an insulation frame common to the two of them.

In an integrated amplifier in which attention is paid to these points of view, and using the circuit diagram shown in the drawing, a voltage gain in operation of roughly 1,000 times has been obtained, which is more than sufficient for use in a telephone set. Other advantages of a circuit according to the invention are that a comparatively high output power is obtained and that the supply voltage can drop to a couple of volts or even one volt without the gain falling too much. The entire amplifier with associated external components, if any, can be fed from a subscriber's line via the fullwave rectifier 18, whereby correct operating voltage polarities are always obtained irrespective of the manner of connection of subscriber's line. The parts of the associated telephone set have not been shown, as they are not essential for the invention.

The invention is not limited to the embodiment described and shown but variations and modifications are possible within the scope of the invention specified in the appended claims. It is thus possible, while retaining the already indicated principles concerning the integration of the group of resistors associated with the voltage gain unit and of resistor 6, to raise the degree of amplification further by using instead of transistor Q1, a Darlington transistor amplifier (see U.S. Pat. Specification No. 2,663,806). It is also possible to replace capacitor 9 by an avalanche diode intended for low voltage, in which case the avalanche voltage of this diode can amount to 3.5 volts. This can be realized under certain circumstances, but in such a circuit the supply voltage may not fall to too low a value. The capacitor 9 in the circuit diagram shown has a more favourable effect with respect to the maintenance of constant voltage and allows a lower supply voltage.

Within amplifier techniques the method is known of replacing a decoupling capacitor by a constant current circuit which can be so connected that, with respect to the feed of transistors Q1 and Q2, it acts as a constant current generator. A constant current circuit of this kind may contain one or more transistors plus an avalanche diode with low avalanche voltage. A constant current circuit of this kind could then replace capacitor 9, but it has the same disadvantage as the simple avalanche diode in that it does not allow the supply voltage to fall to such low values as can be allowed when using capacitor 9.

We claim:

1. An integrated amplifier for connecting a microphone of a telephone set to the subscriber's line of the telephone set comprising a silicon monolithic wafer divided into separate regions by insulating frames, a first voltage supply conductor on said wafer and extending across at least first and second of said regions, a second voltage supply conductor on said wafer and including a first portion in said first region and a second portion in a third region, a decoupling resistor formed on said wafer and extending from within said first region to within said third region for connecting the first portion of said second voltage supply conductor to the second portion thereof, a pair of output terminals adapted to be connected to the subscriber's line, the first of said output terminals being connected to said first voltage supply conductor, the second of said output terminals being connected to the free end of the second portion of said second voltage supply conductor, a decoupling capacitor external of said wafer connecting the first portion of said second voltage supply conductor to said first voltage supply conductor, at least a first preamplifier transistor having input, output and reference electrodes formed on said wafer within a fourth region defined by an insulating frame, first and second biasing resistors formed serially on said wafer in said first region and connecting said first and second voltage supply conductors, means formed on said wafer for connecting the junction of said biasing resistors to the input electrode of said transistor, means for connecting the output electrode of said first preamplifier transistor to the first portion of said second voltage supply conductor, means for connecting the reference electrode of said first preamplifier transistor to said first voltage supply conductor, a pair of input terminals adapted to be connected to the microphone of the telephone set, one of said input terminals being connected to the input terminal of said first preamplifier transistor, at least one output transistor amplifier having input, output and reference electrodes, said output transistor amplifier being formed on said wafer within said second region defined by an insulation frame, means formed on said wafer for connecting the reference and output electrodes of said output transistor amplifier to said first and second output terminals, respectively, and coupling means formed on said wafer for connecting the input electrode of said output transistor amplifier to the output electrode of said first preamplifier transistor.

2. The integrated amplifier of claim 1 wherein the means for connecting the output electrode of said first preamplifier transistor to said second voltage supply conductor is a first collector resistor formed on said wafer in said first region, and wherein said coupling means comprises a second preamplifier transistor having input, output and reference electrodes formed on said wafer within a fifth region defined by an insulating frame, a third biasing resistor formed on said wafer in said first region and connecting the input electrode of said second preamplifier transistor to said first voltage supply conductor, means formed on said wafer for connecting the output electrode of said first preamplifier transistor to the input electrode of said second preamplifier transistor, means formed on said wafer for connecting the reference electrode of said second preamplifier transistor to the first portion of said second voltage supply conductor, and means formed on said wafer for connecting the output electrode of said second preamplifier transistor to the input electrode of said output transistor amplifier.

3. The integrated amplifier of claim 2 further comprising a further resistor connected in series with said decoupling capacitor.

4. The integrated amplifier of claim 2 further comprising a full-wave rectifier means having two input connectors for connection to the two wires of the subscriber's line and two output connectors, respectively, connected to said two output terminals.

5. The integrated amplifier of claim 4 wherein an accessory impedance connects said first output terminal to one of the output connectors of said full-wave rectifier means.

6. The integrated amplifier of claim 2 wherein said first and second preamplifier transistors are of complementary npn and pnp types.

7. The integrated amplifier of claim 2 wherein said output transistor amplifier comprises two transistors connected in a Darlington configuration.

* * * * *